US012803244B2

(12) United States Patent
Kumar et al.

(10) Patent No.: US 12,803,244 B2
(45) Date of Patent: Nov. 17, 2026

(54) INTEGRATED SILICON (SI) TUNABLE LASER

(71) Applicant: Intel Corporation, Santa Clara, CA (US)

(72) Inventors: Ranjeet Kumar, Milpitas, CA (US); Duanni Huang, San Jose, CA (US); Guan-Lin Su, Sunnyvale, CA (US); Xinru Wu, San Jose, CA (US); Richard Jones, San Mateo, CA (US); Haisheng Rong, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 428 days.

(21) Appl. No.: 18/459,184

(22) Filed: Aug. 31, 2023

(65) Prior Publication Data

US 2024/0195148 A1 Jun. 13, 2024

Related U.S. Application Data

(60) Provisional application No. 63/431,255, filed on Dec. 8, 2022.

(51) Int. Cl.
*H01S 5/06* (2006.01)
*G02B 6/125* (2006.01)
*H01S 5/00* (2006.01)
*H01S 5/0687* (2006.01)

(52) U.S. Cl.
CPC ............ *H01S 5/0687* (2013.01); *G02B 6/125* (2013.01); *H01S 5/0085* (2013.01)

(58) Field of Classification Search
CPC ...... H01S 5/0687; H01S 5/0085; G02B 6/125
See application file for complete search history.

(56) References Cited

U.S. PATENT DOCUMENTS

| | | | | |
|---|---|---|---|---|
| 7,230,963 B2 * | 6/2007 | Menon | H01S 5/06256 | 372/50.1 |
| 7,302,124 B2 * | 11/2007 | Forrest | G02B 6/12004 | 385/14 |
| 7,327,910 B2 * | 2/2008 | Forrest | B82Y 20/00 | 372/50.1 |
| 7,565,084 B1 * | 7/2009 | Wach | H04J 14/04 | 398/201 |
| 7,636,522 B2 * | 12/2009 | Nagarajan | H04B 10/506 | 398/79 |
| 7,657,179 B2 * | 2/2010 | Mahgerefteh | H04J 14/02 | 398/91 |

(Continued)

OTHER PUBLICATIONS

M. Finot et al., "Automated optical packaging technology for 10 Gb/s transceivers and its application to a low-cost full C-band tunable transmitter." Intel Technology Journal, 2004, 14 pages.

(Continued)

*Primary Examiner* — Peter Radkowski
(74) *Attorney, Agent, or Firm* — Schwabe, Williamson & Wyatt, P.C.

(57) ABSTRACT

Various embodiments described herein may relate to apparatuses, systems, techniques, and/or processes that are directed to tunable lasers. Specifically, embodiments herein may relate to chips that include both a tunable laser portion as well as a WLL portion on a same silicon substrate. Other embodiments may be described and/or claimed.

17 Claims, 8 Drawing Sheets

(56) References Cited

U.S. PATENT DOCUMENTS

| | | | | |
|---|---|---|---|---|
| 7,940,819 | B2 * | 5/2011 | Takabayashi | H01S 5/0687 372/20 |
| 7,965,949 | B1 * | 6/2011 | Wach | H04B 10/506 398/143 |
| 7,982,944 | B2 * | 7/2011 | Kippenberg | G02F 1/39 372/32 |
| 8,340,478 | B2 * | 12/2012 | Popovic | G02B 6/12007 385/32 |
| 8,521,038 | B1 * | 8/2013 | Wach | H04J 14/02216 398/201 |
| 8,532,441 | B2 * | 9/2013 | Rasras | G02B 6/26 385/5 |
| 8,588,570 | B2 * | 11/2013 | Rong | H01L 22/14 385/132 |
| 8,611,750 | B2 * | 12/2013 | Lei | H04B 10/506 398/32 |
| 8,643,943 | B2 * | 2/2014 | Todt | H01S 5/141 359/333 |
| 8,767,792 | B2 * | 7/2014 | Bowers | H01S 5/0424 372/74 |
| 8,774,236 | B2 * | 7/2014 | Ter-Mikirtychev | H01S 3/0092 372/5 |
| 8,817,827 | B2 * | 8/2014 | Ter-Mikirtychev | H01S 3/06758 372/5 |
| 9,031,412 | B2 * | 5/2015 | Nagarajan | B82Y 20/00 398/95 |
| 9,057,839 | B2 * | 6/2015 | Rasras | B29D 11/00663 |
| 9,065,572 | B1 * | 6/2015 | Wach | H04J 14/02216 |
| 9,195,079 | B2 * | 11/2015 | Doerr | H04B 10/614 |
| 9,559,487 | B2 * | 1/2017 | Doerr | H01S 5/3235 |
| 9,653,882 | B1 * | 5/2017 | Zheng | H01S 5/142 |
| 9,722,397 | B2 * | 8/2017 | Takabayashi | H01S 5/142 |
| 9,746,608 | B1 * | 8/2017 | Rabiei | G03F 7/0005 |
| 9,755,753 | B2 * | 9/2017 | Blumenthal | H01S 5/0085 |
| 9,762,034 | B2 * | 9/2017 | Takabayashi | H01S 5/1209 |
| 9,766,403 | B2 * | 9/2017 | Jiang | H04B 10/506 |
| 9,966,724 | B2 * | 5/2018 | Takabayashi | H01S 5/4087 |
| 10,012,794 | B2 * | 7/2018 | D'Agostino | G02B 6/2813 |
| 10,031,290 | B2 * | 7/2018 | Wohlfeil | H04B 10/572 |
| 10,067,031 | B2 * | 9/2018 | Vahala | G05D 25/02 |
| 10,067,293 | B2 * | 9/2018 | Menard | H01L 23/5286 |
| 10,079,472 | B2 * | 9/2018 | Doerr | H01S 5/50 |
| 10,128,635 | B2 * | 11/2018 | Ring | H01S 5/209 |
| 10,355,448 | B2 * | 7/2019 | Sugiyama | H01S 5/101 |
| 10,466,421 | B2 * | 11/2019 | Menard | G02B 6/3596 |
| 10,468,851 | B1 * | 11/2019 | Doerr | H01S 5/1032 |
| 10,480,993 | B2 * | 11/2019 | Hsu | G01J 9/0246 |
| 10,534,137 | B2 * | 1/2020 | Menard | H01L 23/53238 |
| 10,637,208 | B1 * | 4/2020 | Nagarajan | H01S 5/0656 |
| 10,670,803 | B2 * | 6/2020 | Daniel | G02B 6/29341 |
| 10,670,939 | B2 * | 6/2020 | Liu | G01J 3/45 |
| 10,714,894 | B1 * | 7/2020 | Doerr | H01S 5/101 |
| 10,739,256 | B1 * | 8/2020 | Rickman | G01N 21/3581 |
| 10,745,304 | B2 * | 8/2020 | Fahs, II | C02F 1/725 |
| 10,754,091 | B1 * | 8/2020 | Nagarajan | G02B 6/4226 |
| 10,816,723 | B2 * | 10/2020 | Doerr | G02F 1/011 |
| 10,838,145 | B2 * | 11/2020 | Nagarajan | H01S 5/02375 |
| 10,969,334 | B2 * | 4/2021 | Rickman | G01N 21/3581 |
| 11,009,664 | B2 * | 5/2021 | Menard | H01S 5/021 |
| 11,086,078 | B2 * | 8/2021 | Menard | G02B 6/124 |
| 11,086,079 | B2 * | 8/2021 | Menard | G02B 6/12002 |
| 11,105,988 | B2 * | 8/2021 | Liang | H10F 39/107 |
| 11,112,491 | B2 * | 9/2021 | Abediasl | G01S 7/484 |
| 11,221,446 | B2 * | 1/2022 | Koda | H01S 5/06255 |
| 11,320,587 | B2 * | 5/2022 | Oldenbeuving | G02B 6/29343 |
| 11,329,452 | B2 * | 5/2022 | Nagarajan | H01S 5/0612 |
| 11,355,900 | B2 * | 6/2022 | Nagarajan | H01S 5/02415 |
| 11,387,626 | B1 * | 7/2022 | Doerr | H01S 3/10007 |
| 11,394,464 | B2 * | 7/2022 | Nagarajan | H01S 5/1032 |
| 11,409,035 | B1 * | 8/2022 | Doerr | G02F 1/2257 |
| 11,411,371 | B1 * | 8/2022 | Doerr | H01S 5/142 |
| 11,527,866 | B2 * | 12/2022 | Fujiwara | H01S 5/1007 |
| 11,575,245 | B2 * | 2/2023 | He | H01S 5/0687 |
| 11,639,988 | B2 * | 5/2023 | Sayyah | G01S 7/4815 356/4.01 |
| 11,656,412 | B2 * | 5/2023 | Menard | G02B 6/124 385/14 |
| 11,728,619 | B2 * | 8/2023 | He | H01S 5/142 372/49.01 |
| 11,766,216 | B2 * | 9/2023 | Zilkie | A61B 5/0059 600/301 |
| 11,784,463 | B2 * | 10/2023 | Nagarajan | H01S 5/0656 372/20 |
| 11,804,692 | B2 * | 10/2023 | He | H01S 5/3434 |
| 11,811,195 | B2 * | 11/2023 | Gao | H01S 5/142 |
| 11,811,433 | B2 * | 11/2023 | Nagarajan | H01S 5/021 |
| 11,817,676 | B2 * | 11/2023 | Nagarajan | H01S 5/02253 |
| 12,081,276 | B2 * | 9/2024 | Sakib | H04B 10/614 |
| 12,100,933 | B2 * | 9/2024 | Luo | H01S 5/141 |
| 12,119,616 | B2 * | 10/2024 | Gao | H01S 5/1032 |
| 12,136,951 | B2 * | 11/2024 | Nagarajan | H04B 10/614 |
| 12,212,117 | B2 * | 1/2025 | He | H01S 5/0683 |
| 12,274,039 | B2 * | 4/2025 | Nagashima | H01S 5/02469 |
| 12,418,345 | B2 * | 9/2025 | Nagarajan | H01S 5/1032 |
| 12,490,934 | B2 * | 12/2025 | Zilkie | A61B 5/0059 |
| 2003/0227949 | A1 * | 12/2003 | Meyers | H01S 5/02325 372/50.21 |
| 2005/0249509 | A1 * | 11/2005 | Nagarajan | H01S 5/12 398/198 |
| 2008/0002929 | A1 * | 1/2008 | Bowers | H01S 5/141 385/14 |
| 2008/0285606 | A1 * | 11/2008 | Kippenberg | G02F 1/39 372/32 |
| 2010/0034224 | A1 * | 2/2010 | Takabayashi | H01S 5/0687 372/20 |
| 2010/0158429 | A1 * | 6/2010 | Popovic | G02F 1/225 385/2 |
| 2010/0166424 | A1 * | 7/2010 | Nagarajan | H01S 5/0265 398/79 |
| 2011/0038036 | A1 * | 2/2011 | Todt | H01S 5/0265 359/341.1 |
| 2011/0085794 | A1 * | 4/2011 | Lei | H04J 14/02 398/93 |
| 2012/0080672 | A1 * | 4/2012 | Rong | H01L 22/34 257/E23.002 |
| 2013/0044768 | A1 * | 2/2013 | Ter-Mikirtychev | H01S 3/06758 372/5 |
| 2013/0195137 | A1 * | 8/2013 | Bowers | H01S 5/30 372/44.01 |
| 2013/0209020 | A1 * | 8/2013 | Doerr | G02B 6/12004 385/2 |
| 2014/0050234 | A1 * | 2/2014 | Ter-Mikirtychev | H01S 3/0092 372/6 |
| 2014/0110351 | A1 * | 4/2014 | Fahs, II | C02F 1/32 422/186 |
| 2014/0270618 | A1 * | 9/2014 | Dinu | G02F 1/225 385/3 |
| 2015/0333475 | A1 * | 11/2015 | Blumenthal | H01S 5/0206 372/27 |
| 2016/0013609 | A1 * | 1/2016 | Doerr | H01S 5/4062 372/9 |
| 2016/0041336 | A1 * | 2/2016 | Doerr | G02B 6/2726 398/135 |
| 2016/0156149 | A1 * | 6/2016 | Takabayashi | H01S 5/142 372/6 |
| 2016/0223393 | A1 * | 8/2016 | Hsu | G01J 9/0246 |
| 2016/0327738 | A1 * | 11/2016 | Doerr | H04B 10/40 |
| 2017/0010419 | A1 * | 1/2017 | Jiang | H01S 5/5027 |
| 2017/0017042 | A1 * | 1/2017 | Menard | H01S 5/141 |
| 2017/0017043 | A1 * | 1/2017 | Menard | H01L 23/53238 |
| 2017/0040775 | A1 * | 2/2017 | Takabayashi | H01S 5/50 |
| 2017/0098920 | A1 * | 4/2017 | Doerr | H01S 5/1032 |
| 2017/0139236 | A1 * | 5/2017 | Cao | G02B 6/29338 |
| 2017/0141539 | A1 * | 5/2017 | Ring | H01S 5/124 |
| 2017/0179671 | A1 * | 6/2017 | Takabayashi | H01S 5/1032 |
| 2017/0184787 | A1 * | 6/2017 | D'Agostino | H01S 5/4068 |
| 2017/0346445 | A1 * | 11/2017 | Shen | H04J 14/028 |

(56) References Cited

U.S. PATENT DOCUMENTS

2017/0353008 A1* 12/2017 Sugiyama ............... H01S 5/142
2018/0031873 A1* 2/2018 Kim ...................... G02F 1/0955
2018/0095003 A1* 4/2018 Vahala ..................... G02B 6/12
2018/0100967 A1* 4/2018 Parker ................ G02B 6/12004
2018/0136400 A1* 5/2018 Wohlfeil ............. H01S 3/08027
2018/0334399 A1* 11/2018 Fahs, II .................... C02F 1/36
2018/0364420 A1* 12/2018 Menard ................ G02B 6/3518
2019/0004151 A1* 1/2019 Abediasl ............... G01S 7/4817
2019/0137687 A1* 5/2019 Daniel ................. G02B 6/4286
2019/0196294 A1* 6/2019 Liu ........................... G01J 3/26
2019/0221995 A1* 7/2019 Heaton ................... H01S 5/124
2019/0324198 A1* 10/2019 Oldenbeuving ... G02B 6/29355
2020/0049891 A1* 2/2020 Menard ................... H01S 5/021
2020/0049893 A1* 2/2020 Menard .................. G02B 6/357
2020/0049894 A1* 2/2020 Menard ................... H01S 5/141
2020/0124793 A1* 4/2020 Koda ...................... H01S 5/026
2020/0144790 A1* 5/2020 Nagarajan ........... H01S 5/06256
2020/0161831 A1* 5/2020 Wilmart .................. H01S 5/125
2020/0212651 A1* 7/2020 Nagarajan ............. H01S 5/1007
2020/0219818 A1* 7/2020 Menard ............... H01L 23/5286
2020/0272019 A1* 8/2020 Liu .......................... G01J 3/45
2020/0280173 A1* 9/2020 Gao .................... H01S 5/02415
2020/0301070 A1* 9/2020 Nagarajan .............. G02B 6/126
2020/0301071 A1* 9/2020 Nagarajan .............. H04B 10/40
2020/0333246 A1* 10/2020 Rickman ............ G01N 21/3581
2020/0341193 A1* 10/2020 Nagarajan ............. H01S 5/0234
2020/0409001 A1* 12/2020 Liang .................... H04J 14/022
2021/0036487 A1* 2/2021 Luo ..................... H01S 5/02325
2021/0091536 A1* 3/2021 Nagarajan ............ G02B 6/4212
2021/0119710 A1* 4/2021 Sakib ................... H04B 10/612
2021/0124048 A1* 4/2021 Sayyah ................. G01S 7/4814
2021/0126428 A1* 4/2021 Fujiwara ................. H01S 5/101
2021/0273408 A1* 9/2021 He .......................... H01S 5/028
2021/0349265 A1* 11/2021 Menard .................. G02B 6/357
2022/0013978 A1* 1/2022 He .......................... H01S 5/026
2022/0255295 A1* 8/2022 He ........................ H01S 5/0234
2022/0263289 A1* 8/2022 Nagarajan ............. H01S 5/0261
2022/0285906 A1* 9/2022 He ........................ H01S 5/0683
2022/0285913 A1* 9/2022 Nagarajan ............. H01S 5/0064
2022/0320832 A1* 10/2022 Koch ................... G02B 6/2808
2022/0369524 A1* 11/2022 Nagashima ............ H05K 1/115
2022/0370010 A1* 11/2022 Zilkie .................. A61B 5/0059
2022/0407604 A1* 12/2022 Nagarajan .......... H04B 10/5053
2023/0003938 A1* 1/2023 Zilkie .................. A61B 5/0059
2024/0063602 A1* 2/2024 He ........................ H01S 5/0264
2024/0063606 A1* 2/2024 Gao ...................... H01S 5/1007
2024/0089002 A1* 3/2024 Nagarajan .......... G02B 6/12004
2024/0130677 A1* 4/2024 Zilkie .................. A61B 5/0059
2024/0225540 A9* 7/2024 Zilkie .................. A61B 5/0059
2024/0388366 A1* 11/2024 Sakib ................. H04B 10/6165
2024/0421561 A1* 12/2024 Luo ..................... H01S 5/02325

OTHER PUBLICATIONS

M. Nishita, et al., "Compact Tunable DBR/Ring Laser Module Integrated with Extremely-high-PLC Wavelength Locker", Optical Fiber Communications Conference, paper M2A.6, 2020, 3 pages.
A. Melikyan, et al., "Hybrid III-V/Silicon Laser with Integrated Athermal Wavelength Locker", European Conference on Optical Communication, 2017, 3 pages.
J. C. Hulme, et al., "Widely tunable Vernier ring laser on hybrid silicon", Optics Express 21, 17, 2013, 5 pages.
M. Sakib, et al., "Demonstration of a 50 GB/s all-silicon waveguide photodetector for photonic integration," in Conference on Lasers and Electro-Optics, paper JTh5A.7, 2018, 2 pages.
S. Feng, et al., "Athermal silicon ring resonators clad with titanium dioxide for 1.3 um wavelength operation", Optics Express 23, 20, 2015, 8 pages.

* cited by examiner

INTEGRATED SILICON (SI) TUNABLE LASER

CROSS-REFERENCE TO RELATED APPLICATIONS

The present application claims priority to U.S. 63/431,255, filed Dec. 8, 2022, the contents of which are incorporated herein in their entirety.

BACKGROUND

Embodiments of the present disclosure generally relate to the field of silicon (Si) tunable lasers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
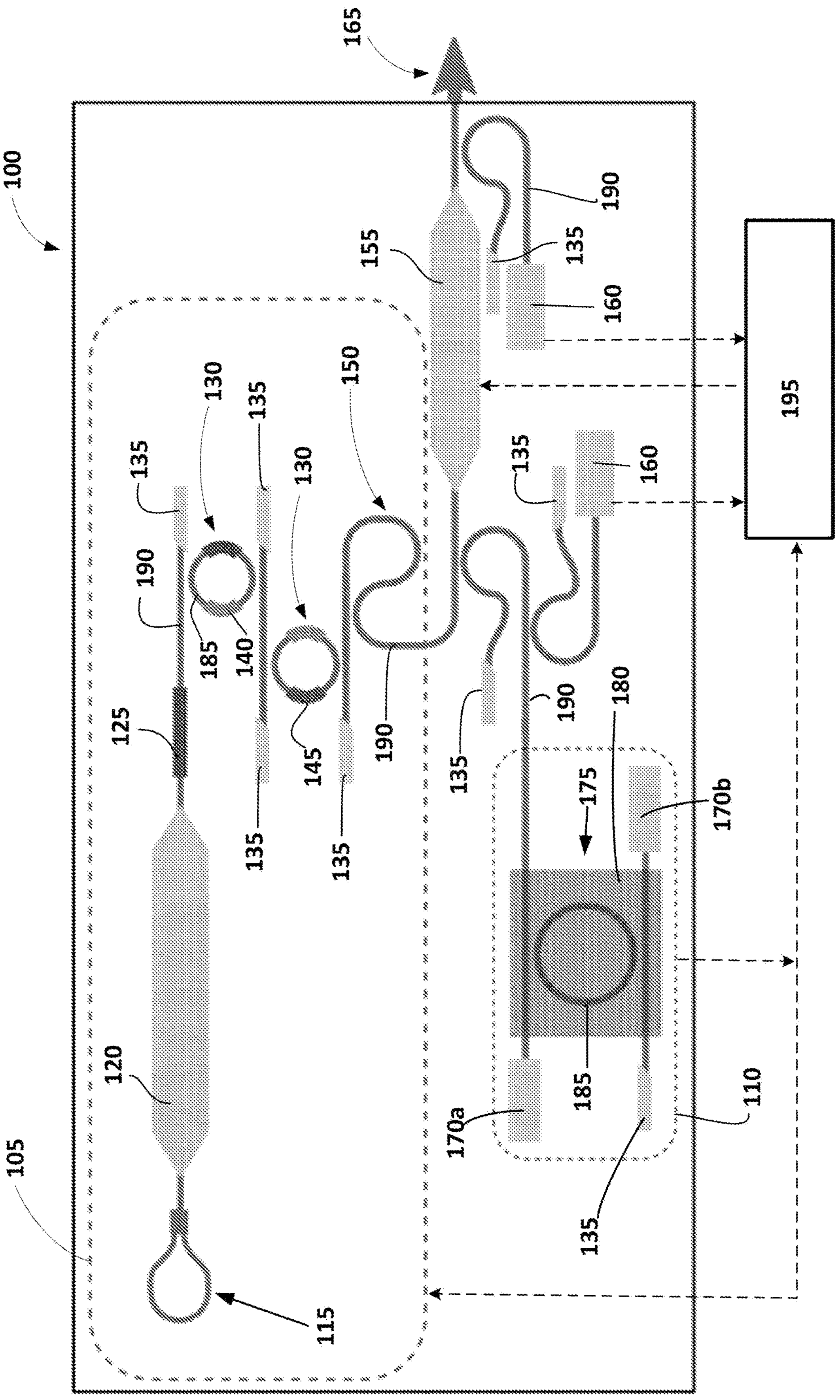
FIG. 1 illustrates an example chip with a tunable laser portion and a wavelength locker (WLL) portion, in accordance with various embodiments.

Various embodiments described herein may relate to apparatuses, systems, techniques, and/or processes that are directed to tunable lasers. Specifically, embodiments herein may relate to chips that include both a tunable laser portion as well as a WLL portion on a same silicon substrate. Other embodiments may be described and/or claimed.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Tunable lasers may be used in high-bandwidth (coherent) optical communications and interconnects, light detection and ranging (LiDAR), and many other sensing and spectroscopic applications. Embodiments herein relate to a fully integrated silicon (Si) tunable laser design, which may offer higher performance and lower fabrication costs compared to legacy laser designs. Specifically, embodiments herein may relate to a tunable laser design that is considered to be "fully integrated" in that various elements of the laser such as a WLL and a tunable laser portion on integrated on a same chip. Such integration may be possible through, for example, the use of a Si-based architecture that includes Si-based photodetectors (PDs) in the tunable laser design, the WLL, and/or other areas of the chip. Through the use of such PDs, the overall cost and/or the foot print of the tunable laser may be significantly reduced at least because the various elements of the tunable laser may be integrated on a single chip rather than integrated as separate elements on, e.g., a circuit board to which the various chips are affixed.

As used herein, the term "tunable laser" may refer to a laser whose output wavelength may be selectively tuned to a wavelength of a plurality of possible wavelengths. For example, a user and/or a computer program may select a specific wavelength. Control logic of the tunable laser may then operate as described below to adjust the output wavelength of the tunable laser based on the selection. The selectable wavelength may be, for example, a wavelength between a wavelength range of 1270 nanometers (nm) and 1330 nm, however in other embodiments the wavelength range may be larger or smaller dependent on the size of the chip, the power supplied to the chip, the specific materials used, etc.

In some embodiments, the tunable laser may be referred to as a "III-V" tunable laser. That is, the tunable laser may be or include elements from groups III and V in the periodic table such as Barium, Aluminum, Gallium, Indium, Nitrogen, Phosphorous, Arsenic, and Antimony. Such elements may be placed on a Si-waveguide.

Various legacy tunable lasers may be categorized into two general categories: 1) external cavity lasers with discrete components and 2) partially (or hybrid) integrated lasers with co-packaged off-chip components such as an external gain chip or a wavelength locker (WLL). However, various of the legacy designs may be undesirable in terms of factors such as cost, size, reliability, cross-talk, etc.

Embodiments herein relate to a fully integrated Si tunable laser, which may be a III-V tunable laser, that overcomes one or more of the above-described disadvantages of the legacy laser designs, and demonstrates promising laser performance. Embodiments may include or relate to one or more of the following: (1) an on-chip integrated tunable laser portion (which may be referred to as a III-V/Si laser gain portion); (2) Si-based photodetectors for laser power and wavelength control; (3) an integrated athermal wavelength reference as wavelength locker; and (4) an integrated optical amplifier to boost the laser output power.

It will be understood that the phrase "fully integrated" may be used herein to describe the various components of the tunable laser integrated on a single chip, rather than legacy designs wherein the various components of the tunable laser were integrated on two or more separate chips (which may or may not have been co-packaged) that were communicatively coupled with one another. Such a tunable laser may be desirable in use cases such as coherent communications and LiDAR. Such tunable lasers may be integrated with other components such as highspeed modulators and detectors on a silicon photonics platform, or as a standalone device, competing with other tunable laser products in the market for their low-cost fabrication and high performance.

The integrated laser design may include various distinct components implemented on a single chip. Such components may include, for example, loop mirrors, ring resonators, III-V gain sections, Si PDs, etc. Some of these components may be seen in the simplified block diagram of FIG. 1. Specifically, FIG. 1 illustrates an example chip 100 with photonic integrated circuit thereon. The photonic integrated circuit may include a tunable laser portion 105 and a WLL portion 110, in accordance with various embodiments. It will be understood that the diagram of FIG. 1 is intended as a high-level example diagram for the sake of discussion of various embodiments herein. Real world implementations may include additional or alternative physical elements such as traces, overmold material, silicon layers, circuit elements such as resistors/capacitors/etc., and/or other elements. It will also be understood that each and every occurrence of an element (e.g., a termination 135 or a Si waveguide 190) may not be numbered for the sake of clarity and lack of clutter of the Figure. However, similarly sized/shaped/shaded elements may be assumed to share characteristics unless specifically indicated to the contrary.

As may be seen in FIG. 1, the tunable laser portion 105 may include a fully reflective back mirror 115, a gain section 120, and a partially reflective front mirror 150. The gain section 120 may be positioned in the optical pathway between the back mirror 115 and the front mirror 150. The optical pathway of the chip 100 may be formed of a plurality of optically coupled Si waveguides 190, along which the optical signal may travel. As may be seen, various of the Si waveguides 190 may terminate at an optical termination 135. The termination 135 may be, for example, a silicon or some other material.

Generally, the gain section 120 may be a III-V gain section, which includes various of the materials described above. As an optical signal passes through the gain section 120, the optical signal is amplified. The fully reflective back mirror 115 and the partially reflective front mirror 150 may serve to reflect the optical signal within the tunable laser portion 105 until such time as the optical signal achieves sufficient amplitude to exit the tunable laser portion 105 at the front mirror 150.

The tunable laser portion 105 may include a number of phase tuners. One such phase tuner is the cavity phase tuner 125. Additional phase tuners may be present on ring resonators 130. Specifically, the rings 130 may include an in-line PD 140 and a phase tuner 145. The two ring resonators 130 may form a Vernier filter that is designed to have slightly different free spectral ranges (FSR), e.g., 1.37 nm and 1.40 nm, respectively, which may result in the Vernier effect and enable a relatively wide wavelength tuning range of the laser. For example, as described above, the wavelength range may be on the order of approximately 1270 nm and 1330 nm (although, as previously noted, in other embodiments the wavelength range may be larger or smaller). It will be understood that, in some cases, ring resonators 130 may additionally or alternatively be referred to as a "ring modulator."

The tuning of the wavelength may be accomplished through the combination of the Vernier filter (e.g., as may be composed of the two ring resonators 130 shown in FIG. 1), and the cavity phase tuner 125. Specifically, the Vernier filter may at least partially determine the laser wavelength. Additionally, the cavity phase tuner 125 may be used to align the laser cavity mode with the Vernier filter, and optimize the laser output power. Such tuning may be achieved by utilizing the thermal-optic effect.

For example, in embodiments, one or both of the cavity phase tuner 125 and the phase tuners 145 of the ring resonators 130 may be composed of micro heaters. The tunable laser portion 105 may be coupled with a control logic 195, which may be implemented as one or more pieces of hardware, software, firmware, etc. In some embodiments, the control logic 195 may be physically separate from, but communicatively coupled with, chip 100. For example, the control logic 195 may be implemented on a same interposer or package substrate as the chip 100, or may be implemented in a separate electronic device from the electronic device in which the chip 100 is located. In other embodiments, the control logic 195 may be at least partially implemented in an element of the chip 100 (e.g., a piece of firmware present on the chip 100). Other variations may be present in other embodiments.

Although not explicitly shown in FIG. 1 for the sake of clarity of the Figure, the control logic 195 may be communicatively coupled with respective ones of the cavity phase tuner 125 and the phase tuners 145. The control logic 195 may provide one or more control signals to respective ones of the phase tuners 125/145 to heat or cool respective ones of the phase tuners 125/145. As is shown in greater detail in FIG. 2, the phase tuners may be positioned adjacent to a Si ring 185 or a Si waveguide 190. When the phase tuner(s) 125/145 are heated or cooled, the thermal energy (or lack thereof) may tune the wavelength of the optical signal to a desired wavelength as it travels through the Si ring 185/Si waveguide 190.

Figure 2B:
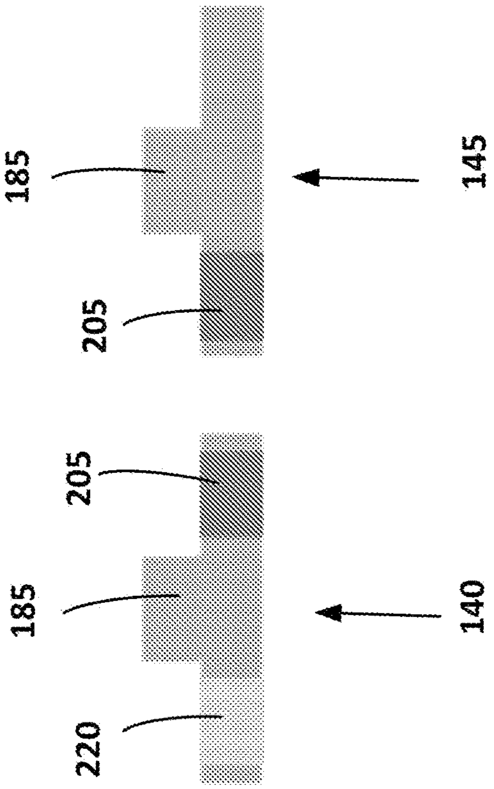
FIGS. 2A and 2B (collectively, "FIG. 2") illustrate an example of a ring resonator for use in a tunable laser portion, in accordance with various embodiments.
Figure 2A:
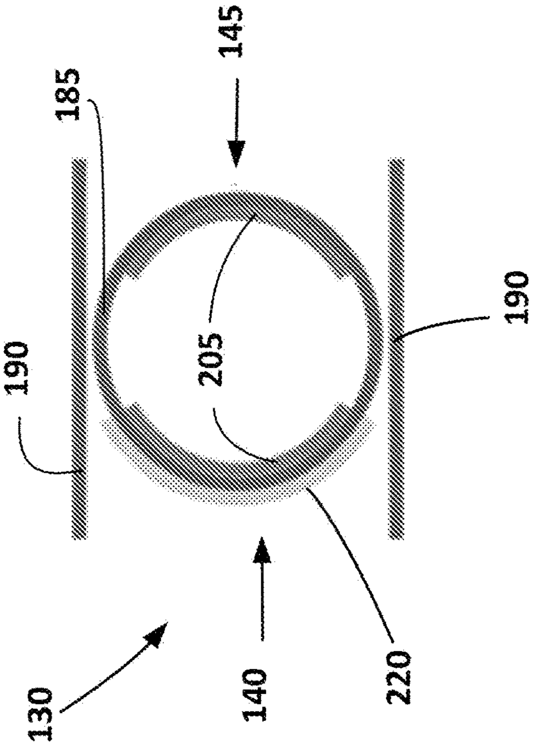

FIG. 2 depicts an example of a ring resonator 130. As shown in FIG. 2A, the ring resonator 130 may be positioned between, and optically coupled to, two Si waveguides 190. The ring resonator 130 may, itself, include Si ring 185. Generally, the Si ring 185 may be formed similarly to Si waveguide(s) 190 in that it may include a silicon waveguide along which the optical signal may propagate through the Si ring 185. However, the Si ring 185 is numbered separately for the sake of clarity of discussion The ring resonator 130 may include an in-line Si PD 140, which may also be referred to as a monitor PD (MPD). In some embodiments the PDs 140 may be referred to as "low-loss" PDs. The in-line Si PD 140 may be formed of an n-doped Si portion 220 and a p-doped Si portion 205. The n-doped Si portion 220 and the p-doped Si portion 205 may be positioned on opposite sides of the Si ring 185. The ring resonator 130 may further include a phase tuner 145. As shown in FIG. 2A, the phase tuner 145 may include a p-doped Si portion 205 adjacent to the Si ring 185.

FIG. 2B depicts example cross-sectional views of the in-line Si PD 140 and the phase tuner 145. As seen in FIG. 2B, the phase tuner 145 may include the p-doped Si portion 205 adjacent to the Si ring 185. In operation, an externally generated current may be applied to the p-doped portion 205, which in turn may cause the p-doped Si portion 205 to generate heat.

As may be seen in FIG. 2B, the in-line Si PD 140 may include the n-doped Si portion 220 and the p-doped Si portion 205 adjacent to the Si ring 185. In operation, as the optical signal propagates through the Si ring 185, it may cause a current between the n-doped Si portion 220 and the p-doped Si portion 205. The resultant current may be measured. In embodiments, the Si PDs 140 may be used to align the optical signal with laser cavity modes by maximizing the photocurrents of individual ones of the Si PDs 140.

Figure 5:
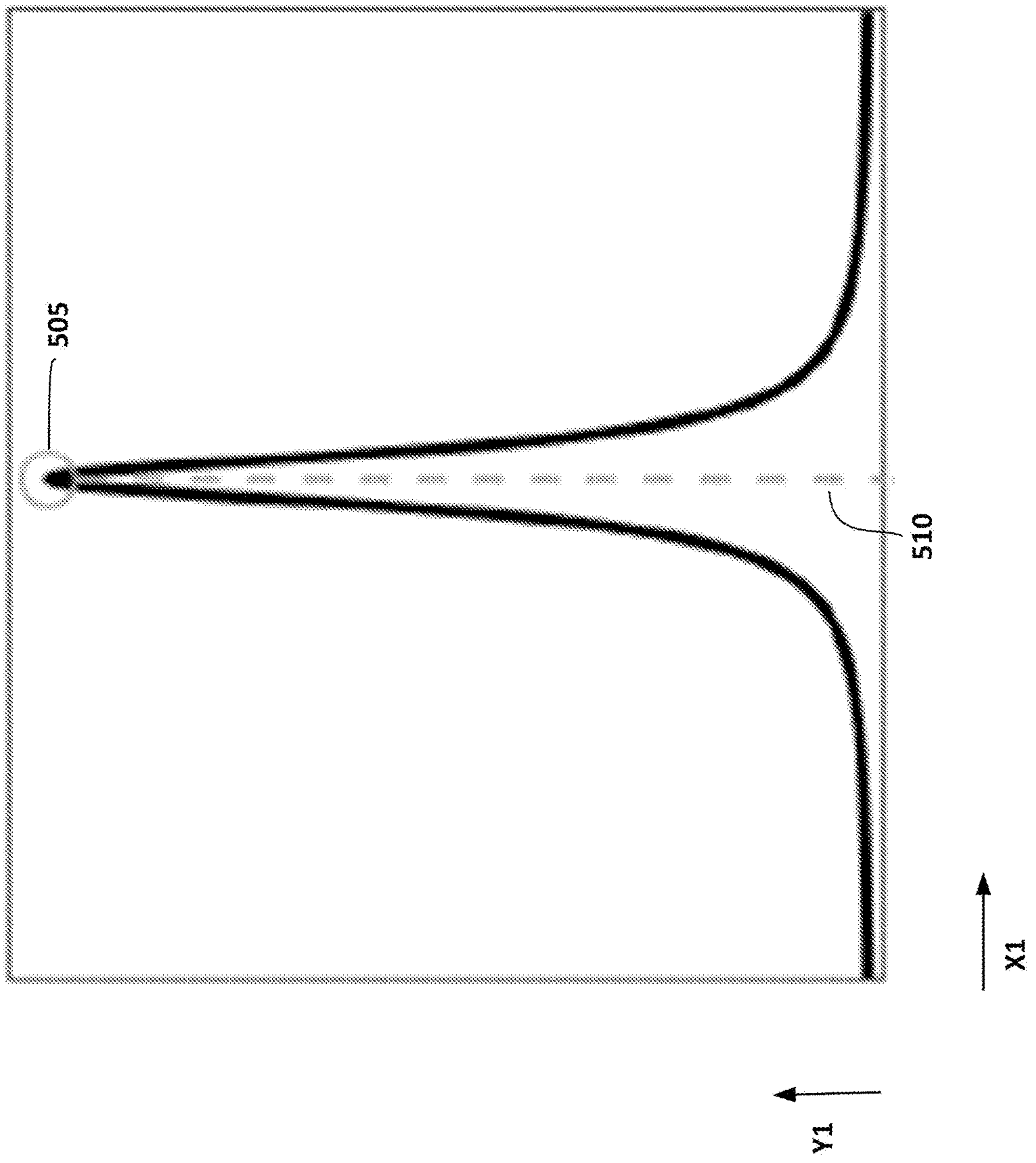
FIG. 5 illustrates an example of photo-current inside a ring resonator as a function of wavelength, in accordance with various embodiments.

FIG. 5 shows the photocurrent of a PD such as PD 140 as a function of the wavelength of the optical signal within the tunable laser portion 105. The X axis, X1, depicts the wavelength of the optical signal, and the Y axis, Y1, depicts the photocurrent generated by the PD 140. When the optical signal is on resonance (e.g., at a wavelength that corresponds to a resonant frequency of the ring resonator 130. In this example, the resonant frequency corresponds to the wavelength at point 510 of FIG. 5), the photocurrent reaches maximum as shown at point 505. As described above, the resonance of a ring resonator 130 maybe tuned by a thermal phase tuner such as phase tuner 145. By monitoring the photocurrents from the various in-line Si PDs 140, and providing one or more control signals to various ones of the phase tuners 125/145, the control logic 195 may be configured to tune the wavelength of the optical signal within the tunable laser portion 105 to a frequency/wavelength that optimizes the laser power.

It will be noted that, in various embodiments, the cavity phase tuner 125 may be constructed similarly, and may operate similarly, to the phase tuner(s) 145 previously described. In other embodiments, one or more of the cavity phase tuner 125 and the phase tuners 145 may be constructed differently from one another. It will also be noted that the specific configuration or description of the various elements such as the phase tuner(s) and/or the Si PD(s) are intended as examples of such an element. In other embodiments, one or more of the phase tuner(s) and/or the Si PD(s) may be implemented differently while still accomplishing a similar goal of either selectively adjusting the wavelength of the optical signal within the tunable laser portion 105 (in the case of the phase tuner(s)) or monitoring the wavelength and/or current of the optical signal within the tunable laser portion (in the case of the Si PDs). For example, in some embodiments the doping of different portions of the Si PD(s) or the phase tuner(s) may be different, the type of phase tuner may be different (e.g., it may be implemented separately from the Si waveguide 190 and/or Si ring 185), etc.

Generally, as described above, embodiments may use the in-line Si PDs 140 to monitor the power and/or wavelength of the optical signal at various places along the Si waveguide 190/Si ring 185 inside and outside of the tunable laser portion 105. As will be described in further detail below, the WLL portion 110 may additionally include one or more Si PDs that may be similar to Si PDs 140. These Si PDs may be easier to fabricate compared to germanium (Ge) based PDs such as those that may be used in legacy designs of silicon photonic chips for power monitoring purposes or other purposes.

Figure 3:
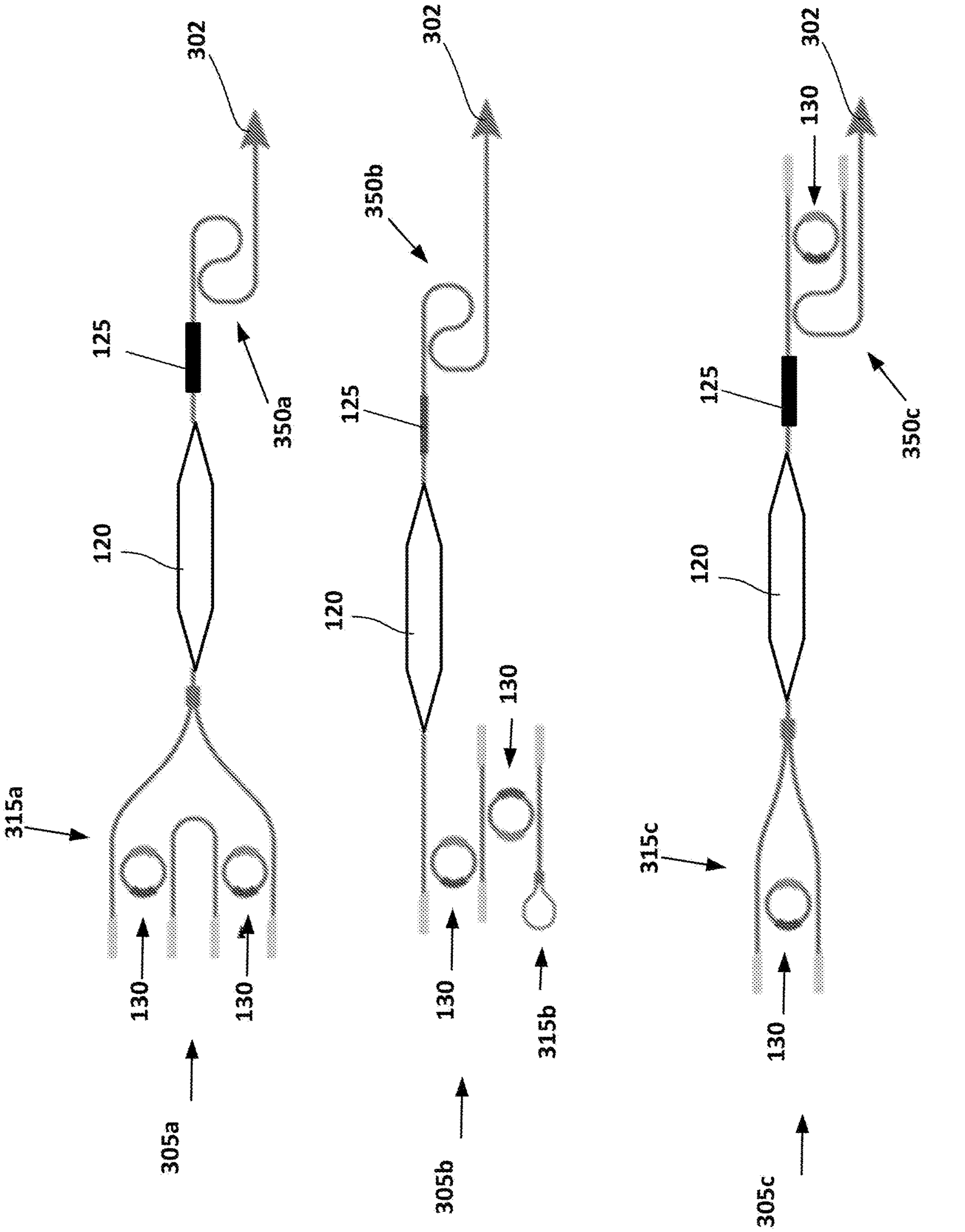
FIG. 3 illustrates alternative example configurations of a tunable laser portion, in accordance with various embodiments.

FIG. 3 depicts alternative example configurations of a tunable laser portion, in accordance with various embodiments. For example, the tunable laser portion 305*a* may include a back mirror 315*a* and a front mirror 350*a* that may function similarly to back mirror 115 and front mirror 150. Similarly to the tunable laser portion 105, the optical signal may be output from the tunable laser portion to another element of the chip (e.g., an amplifier and/or a WLL) at 302. It will be noted that, while tunable loser portion 105 included the ring resonators 130 between the phase tuner 125 and the output (unmarked in FIG. 1 for the sake of lack of clutter of the Figure), in the embodiment, of the tunable laser portion 305*a*, the ring resonators 130 are located in the back mirror 315*a*.

Similarly, the tunable laser portion 305*b* may include a back mirror 315*b* and a front mirror 350*b* that may function similarly to back mirror 115 and front mirror 150. In this embodiment, the ring resonators 130 are located between the back mirror 315*b* and the gain section 120.

Similarly, the tunable laser portion 305*c* may include a back mirror 315*c* and a front mirror 350*c*, which may function similarly to back mirror 115 and front mirror 150. In this embodiment, one ring resonator 130 is located in the back mirror 315*c*, and one ring resonator 130 is located in the front mirror 350*c*.

It will be noted that the examples of FIG. 3 are intended as examples of possible configurations, and other embodiments may include additional or alternative configurations of such a tunable laser portion on a chip. For example, other embodiments may have additional/alternative locations of ring resonators, different configurations of the various mirrors, etc.

In addition to the tunable laser portion 105, the chip 100 may include a WLL portion 110. After the wavelength of the optical signal is selected and subsequently adjusted such that the optical signal provided by the tunable laser portion 105 is at the selected wavelength, the WLL portion 110 may provide an active feedback signal to the control logic 195. The control logic 195 may use the feedback signal to facilitate a initial selection of a wavelength of the laser, a change in the selected wavelength, or to compensate for wavelength drift of the tunable laser portion 105. For example, as various elements of the tunable laser portion 105 age (e.g., the ring resonators 130), the wavelength of the optical signal that is output from the tunable laser portion 105 may begin to drift from the selected wavelength. Other factors that may contribute to wavelength drift may include the chip 100 heating up due to use, the ambient temperature of the environment where the chip 100 is being used, etc. As used herein, the phrase “locking” will be used to generally refer to the placement and maintenance of the wavelength of the optical signal at the selected wavelength. For example, “locking” the wavelength may either place the wavelength at the selected wavelength (in the case of initial selection or re-selection of the selected wavelength) and/or minimization of wavelength drift. Such locking may be performed by control logic 195 based on the feedback provided by the WLL.

Generally, it is desirable for the WLL portion 110 to be athermal such that changes in temperature do not affect the feedback signal provided by the WLL portion 110. In the example WLL portion 110 of FIG. 1, the WLL portion 110 may include a Si ring resonator 175 with a Si ring 185. The WLL portion 110 may further include a titanium dioxide ($TiO_2$) waveguide cladding 180. Two Si PDs, 170*a* and 170*b* (which may be respectively similar to PDs such as Si PDs 140) may also be included in the WLL portion 110. In this embodiment, the negative thermo-optic coefficient (TOC) of the $TiO_2$ waveguide cladding 180 may compensate for the positive TOC of the Si ring 185, resulting in negligible net temperature shift of the ring resonances of the ring resonator 175.

Figure 4:
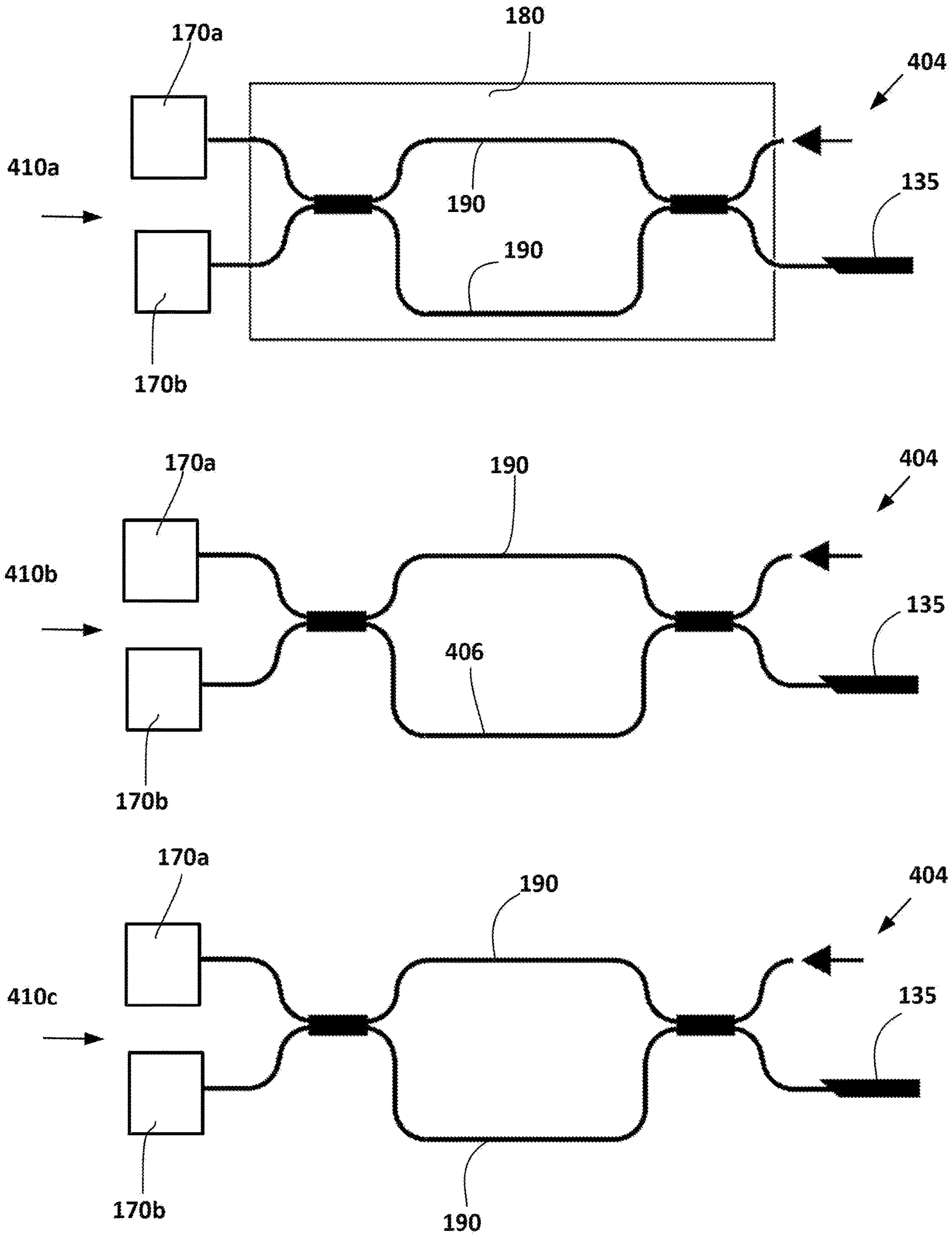
FIG. 4 illustrates alternative example configurations of a WLL, in accordance with various embodiments.

FIG. 4 depicts alternative examples of WLLs that may be used as the WLL portion 110. For example, WLL portion 410*a* may include a Mach-Zehnder Interferometer (MZI) configuration with $TiO_2$ cladding. The MZI may be formed of the two Si waveguides 190, with a $TiO_2$ cladding 180. The WLL portion 410*a* may receive an input optical signal (e.g., from a tunable laser portion such as tunable laser portion 105) at 404. Similarly to the WLL portion 110, the negative TOC of the $TiO_2$ cladding 180 may compensate for the positive TOC of the two Si waveguides 190, resulting in negligible net temperature shift of the MZI spectral resonance.

WLL portion 410*b* may include a MZI design with a silicon-nitride (SiN) waveguide 406. By combining a Si waveguide 190 and a SiN waveguide 406 with a pre-selected length inside the MZI, the temperature-dependent refractive index of the Si waveguide 190 may be counteracted by the smaller temperature-dependent refractive index of the SiN waveguide 406. This may result in an MZI, and therefore a WLL portion, whose spectral response is independent of temperature.

WLL portion 410*c* may include two Si waveguides 190. However, in contrast to WLL portion 410*a*, the WLL portion 410*c* may not include a $TiO_2$ cladding 180. By pre-selecting and incorporating different cross-sections (e.g., different waveguide heights and/or widths) and/or lengths of the two Si waveguides 190, it may become feasible to offset the temperature-dependent refractive index changes of the Si waveguides 190. This may result in a pure silicon-based athermal WLL portion 410*c*, which may reduce or eliminate the need for additional integration of an SiN waveguide (e.g., SiN waveguide 406) or $TiO_2$ cladding 180.

As described above, the WLL portion 110 (or some other WLL portion herein) may be used to monitor the wavelength of the optical signal output from the tunable laser portion 105, and facilitate locking of the wavelength at a selected wavelength. Specifically, the WLL portion 110 may include PDs 170*a* and 170*b*. The wavelength of the optical signal output by the tunable laser portion 105 may produce a current in both PDs 170*a* and 170*b*. The measured currents, or indications thereof, may be provided in one or more feedback signals to a logic such as control logic 195. The control logic 195 may compare the measured currents from PDs 170*a* and 170*b*. For example, in some embodiments, the control logic 195 may identify the differential between the measured currents of the two PDs 170*a* and 170*b*. Such a differential may be identified as [Measured current of PD 170*a*]-[Measured current of PD 170*b*]. However, it will be recognized that, in other embodiments, the differential may be identified in some other manner or according to some other function.

Figure 6:
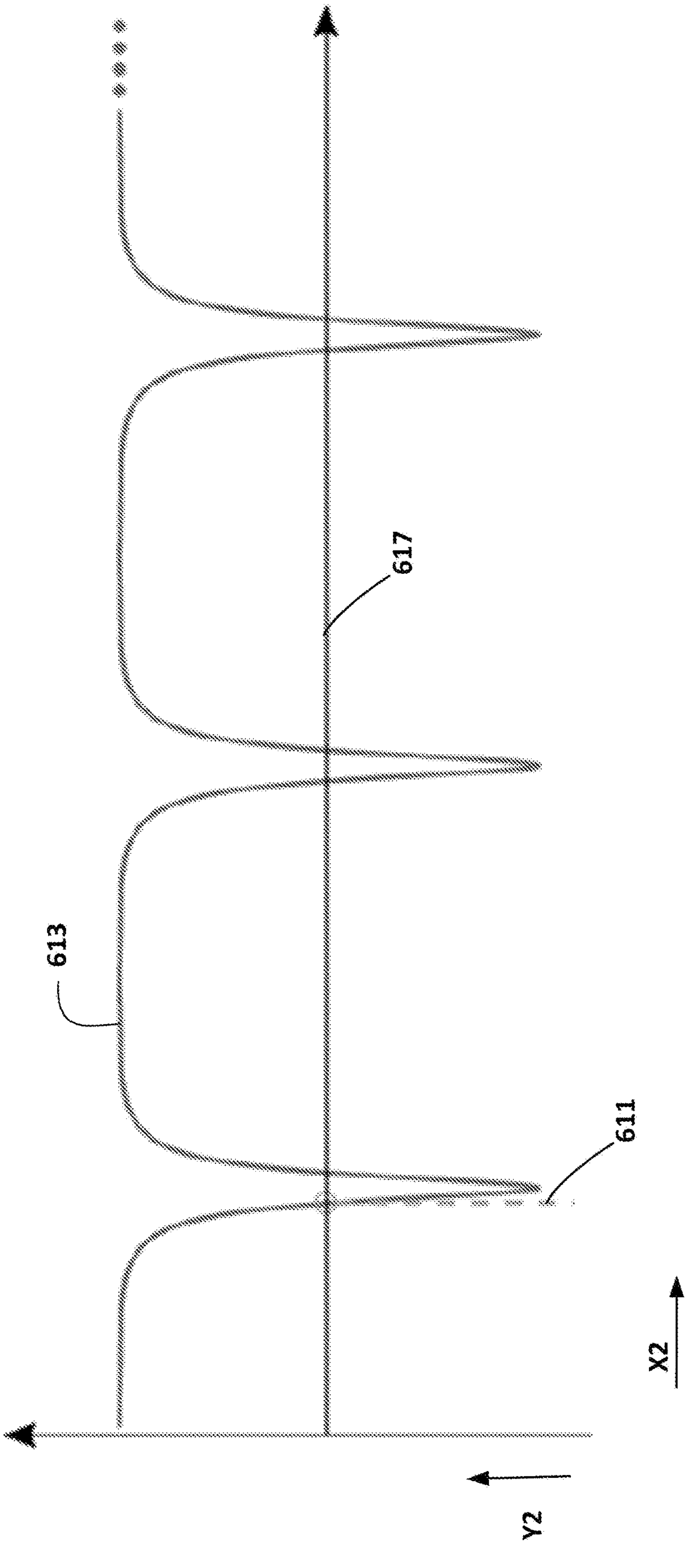
FIG. 6 illustrates an example of output of a WLL, in accordance with various embodiments.

FIG. 6 depicts an example of such a comparison. The Y axis of FIG. 6 (Y2) represents the above-described differential between the currents measured at PDs 170*a* and 170*b*. The X axis of FIG. 6 (X2) represents the wavelength of the optical signal. As may be seen in FIG. 6, the measured differential 613 may have a periodic profile where the differential 613 is 0 (e.g., intersects with line 617). One such point is at 611. Such a point may be referred to as a “locking point.” The locking points represent a situation in which the wavelength of the optical signal output by the tunable laser 105 is the selected wavelength (e.g., wavelength drift is minimized). The periodic profile represents a number of such wavelengths.

If the differential 613 is not at the locking point 611, then the control logic 195 may provide a control signal to one or more of the various phase tuners 125/145 of the tunable laser portion 105. As a result of the control signal(s) provided by the control logic 195, one or more of the phase tuners 125/145 may heat up or cool down, thereby adjusting the wavelength of the optical signal. In this way, the WLL portion 110 may provide an active feedback mechanism to the control logic 195, which the control logic 195 can then use to maintain the wavelength of the optical signal at the selected wavelength through adjustment within the tunable laser portion 105.

In addition to the tunable laser portion 105 and the WLL portion 110, the chip 100 may include an amplifier 155. The amplifier 155 may be include a III-V material as described above and may be similar to, for example, gain 120. The amplifier 155 may be configured to change an amplitude of the optical signal provided by the tunable laser 105 prior to output of the optical signal from the chip at output 165. The output 165 may be, for example, an output port such as a port to couple with an optical fiber or some other output.

In some embodiments, the amplifier 155 may be configured to increase the amplitude of the optical signal. Additionally or alternatively, if the amplifier 155 is reverse-biased, then the amplifier 155 may be configured to attenuate the optical signal (i.e., decrease the amplitude of the optical signal). In various embodiments, the amplifier 155 may be communicatively coupled with logic 195, which may control the degree to which the amplifier 155 amplifies or attenuates that optical signal. Such amplification or attenuation may be based on feedback provided by one or more Si PDs such as Si PDs 160, which may be configured to measure the amplitude of the optical signal and provide feedback on the amplitude to control logic 195.

In some embodiments, the tunable laser provided by a chip such as chip 100 may have one or more of the following characteristics: a wavelength tuning range of the laser >60 nm, on-chip power >10 decibel milliwatts (dBm) with 60 milliamp (mA) bias current, >50 decibel (dB) side-mode suppression ratio (SMSR).

Figure 7:
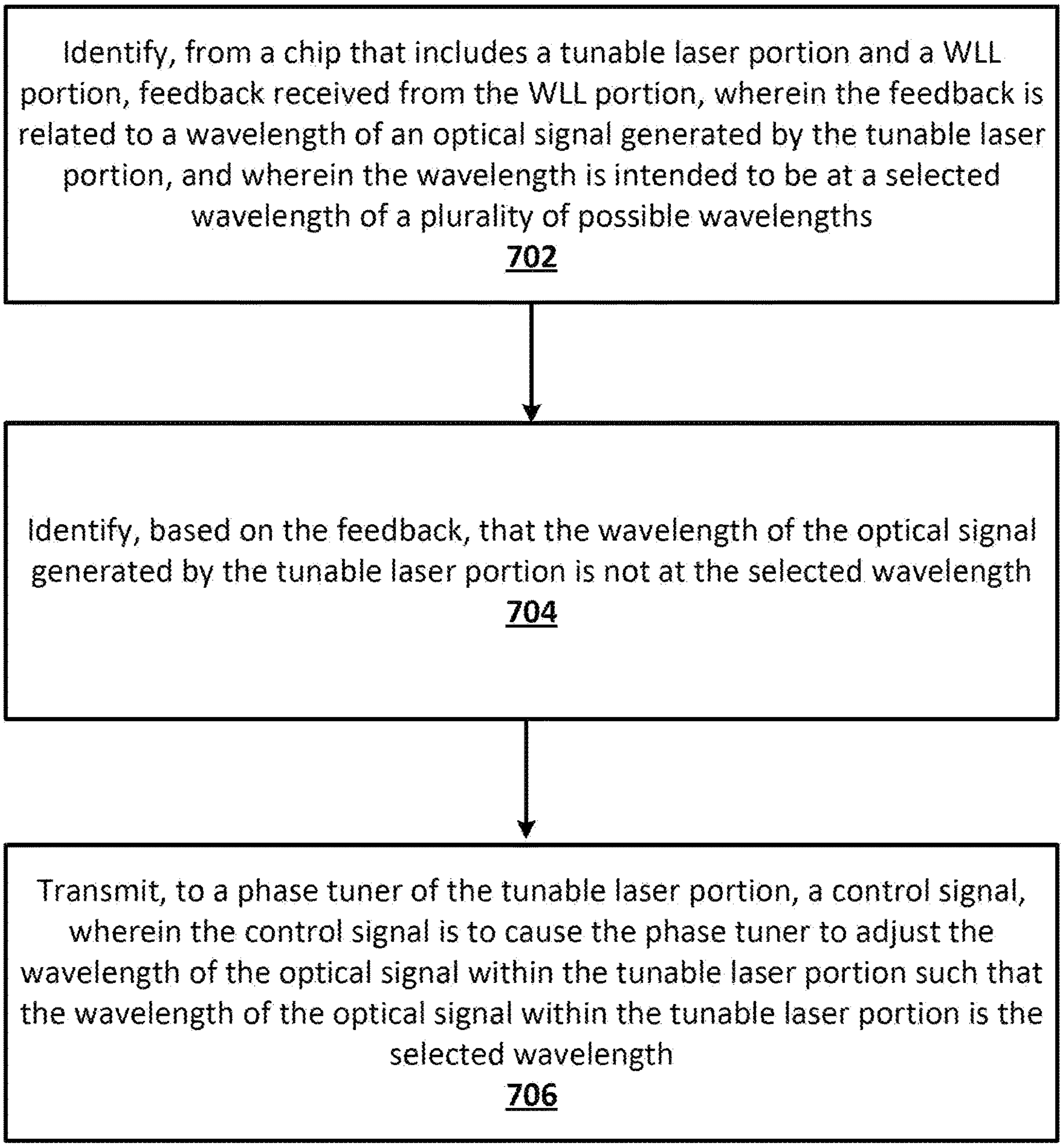
FIG. 7 illustrates an example technique that may be performed by a control logic, in accordance with various embodiments.

FIG. 7 depicts an example process that may be performed by control logic such as control logic 195. In embodiments, the process may include or relate to a method that includes identifying, at 702 from a chip that includes a tunable laser portion and a wavelength locker (WLL) portion, feedback received from the WLL portion, wherein the feedback is related to a wavelength of an optical signal generated by the tunable laser portion, and wherein the wavelength is intended to be at a selected wavelength of a plurality of possible wavelengths. The chip may be similar to, for example, chip 100. The tunable laser portion and the WLL portion may be respectively similar to tunable laser portion 105 and WLL portion 110, or some other tunable laser portion or WLL portion described herein. The feedback may be similar to, for example, the feedback previously described related to the output of PDs 170*a* and 170*b*.

The example process may further include identifying, at 704 based on the feedback, that the wavelength of the optical signal generated by the tunable laser portion is not at the selected wavelength. As previously described, the wavelength of the optical signal may not be at the selected wavelength due to wavelength drift, initial selection of the selected wavelength, re-selection of the selected wavelength, etc.

The example process may further include transmitting, at 706 to a phase tuner of the tunable laser portion, a control signal, wherein the control signal is to cause the phase tuner to adjust the wavelength of the optical signal within the tunable laser portion such that the wavelength of the optical signal within the tunable laser portion is the selected wavelength. The phase tuner may be, for example, one or more of phase tuners 125/145 and/or some other phase tuner.

Figure 8:
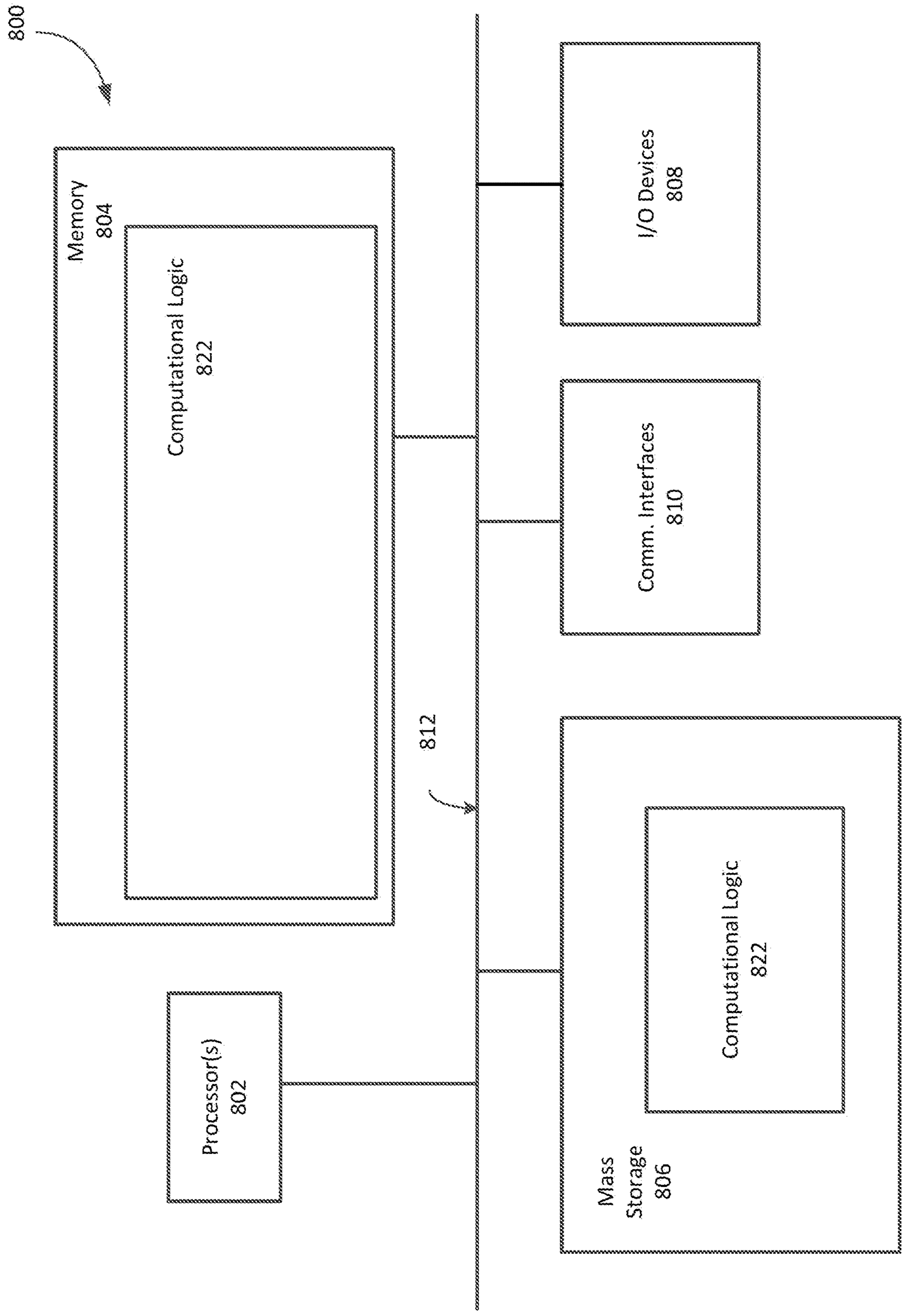
FIG. 8 illustrates an example computing system suitable for practicing various aspects of the disclosure, in accordance with various embodiments.

FIG. 8 illustrates an example computing device 800 suitable for use to practice aspects of the present disclosure, in accordance with various embodiments. For example, the example computing device 800 may be suitable to implement the functionalities described herein, or some other method, process, or technique described herein, in whole or in part.

As shown, computing device 800 may include one or more processors 802, each having one or more processor cores, and system memory 804. The processor 802 may include any type of unicore or multi-core processors. Each processor core may include a central processing unit (CPU), and one or more level of caches. The processor 802 may be implemented as an integrated circuit. The computing device 800 may include mass storage devices 806 (such as diskette, hard drive, volatile memory (e.g., dynamic random access memory (DRAM)), compact disc read only memory (CD-ROM), digital versatile disk (DVD) and so forth). In general, system memory 804 and/or mass storage devices 806 may be temporal and/or persistent storage of any type, including, but not limited to, volatile and non-volatile memory, optical, magnetic, and/or solid state mass storage, and so forth. Volatile memory may include, but not be limited to, static and/or dynamic random access memory. Non-volatile memory may include, but not be limited to, electrically erasable programmable read only memory, phase change memory, resistive memory, and so forth.

The computing device 800 may further include input/output (I/O) devices 808 such as a display, keyboard, cursor control, remote control, gaming controller, image capture device, one or more three-dimensional cameras used to capture images, and so forth, and communication interfaces 810 (such as network interface cards, modems, infrared receivers, radio receivers (e.g., Bluetooth), and so forth). I/O devices 808 may be suitable for communicative connections with three-dimensional cameras or user devices. In some embodiments, I/O devices 808 when used as user devices may include a device necessary for implementing the functionalities of receiving an image captured by a camera.

The communication interfaces 810 may include communication chips (not shown) that may be configured to operate the device 800 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 810 may operate in accordance with other wireless protocols in other embodiments.

The above-described computing device 800 elements may be coupled to each other via system bus 812, which may represent one or more buses. In the case of multiple buses, they may be bridged by one or more bus bridges (not shown). Each of these elements may perform its conventional functions known in the art. In particular, system memory 804 and mass storage devices 806 may be employed to store a working copy and a permanent copy of the programming instructions implementing the operations and functionalities described herein, or some other method, process, or technique described herein, in whole or in part, generally shown as computational logic 822. Computational logic 822 may be implemented by assembler instructions supported by processor(s) 802 or high-level languages that may be compiled into such instructions.

The permanent copy of the programming instructions may be placed into mass storage devices 806 in the factory, or in the field, though, for example, a distribution medium (not shown), such as a compact disc (CD), or through communication interfaces 810 (from a distribution server (not shown)).

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the present disclosure is to be determined entirely by the following claims, which are to be construed in accordance with established doctrines of claim interpretation.

EXAMPLES

Example 1 includes a laser architecture comprising: a tunable laser block coupled with a chip substrate; a wavelength locker (WLL) block coupled with the chip substrate; and a semiconductor optical amplifier (SOA) block coupled with the chip substrate.

Example 2 includes the laser architecture of example 1, and/or some other example herein, wherein the tunable laser block includes a fully reflective loop mirror as a back reflector.

Example 3 includes the laser architecture of any of examples 1-2, and/or some other example herein, wherein the tunable laser block includes a partially reflective loop mirror as a front reflector.

Example 4 includes the laser architecture of any of examples 1-3, and/or some other example herein, wherein the tunable laser architecture includes a III-V laser gain section, a phase tuning section, and a Vernier-ring filter.

Example 5 includes the laser architecture of example 4, and/or some other example herein, wherein the Vernier-ring filter includes a first ring and a second ring with a free spectral range different than that of the first ring.

Example 6 includes the laser architecture of example 5, and/or some other example herein, wherein the first ring or the second ring includes a thermal tuner section and a silicon monitor photodiode (Si-MPD) section.

Example 7 includes the laser architecture of any of examples 1-6, and/or some other example herein, wherein the WLL block includes a titanium dioxide ($TiO_2$) waveguide cladding.

Example 8 includes the laser architecture of any of examples 1-7, and/or some other example herein, wherein the WLL block includes an athermal ring resonator.

Example 9 may include a chip comprising: a tunable laser portion configured to output, to another element on the chip, an optical signal at a selected wavelength of a plurality of possible wavelengths; a wavelength locker (WLL) portion configured to receive the optical signal from the tunable laser portion and facilitate maintenance of the optical signal at the selected wavelength during wavelength drift; an amplifier configured to receive the optical signal from the tunable laser portion and amplify or attenuate the optical signal to generate an output optical signal; and an output port configured to output the output optical signal from the chip.

Example 10 may include the chip of example 9, and/or some other example herein, wherein the tunable laser portion includes a silicon photodiode configured to facilitate tuning of the optical signal to the selected wavelength.

Example 11 may include the chip of example 10, and/or some other example herein, wherein the silicon photodiode is further configured to facilitate alteration of an amplitude of the optical signal.

Example 12 may include the chip of any of examples 9-11, and/or some other example herein, wherein the optical signal is output from a front mirror of the tunable laser portion to the amplifier.

Example 13 may include the chip of any of examples 9-12, and/or some other example herein, wherein the WLL portion includes an athermal ring resonator.

Example 14 may include the chip of any of examples 9-12, and/or some other example herein, wherein the WLL portion includes an athermal mach-zehnder interferometer (MZI).

Example 15 may include the chip of any of examples 9-14, and/or some other example herein, wherein the WLL portion includes a first silicon photodiode and a second silicon photodiode, wherein maintenance of the optical signal at the selected wavelength is based on feedback generated by the WLL based on a first measurement of the wavelength of the optical signal at the first silicon photodiode and a second measurement of the wavelength of the optical signal at the second silicon photodiode.

Example 16 may include the chip of example 15, and/or some other example herein, wherein maintenance of the optical signal at the selected wavelength is based on a comparison of the first measurement and the second measurement.

Example 17 may include the chip of example 15, and/or some other example herein, wherein the tunable laser portion includes a phase tuner configured to change, based on the feedback, a wavelength of the optical signal within the tunable laser portion prior to provision of the optical signal to the WLL.

Example 18 may include an electronic device comprising: a chip comprising: a tunable laser portion configured to output, to another element of the chip, an optical signal at a selected wavelength of a plurality of possible wavelengths; a wavelength locker (WLL) portion configured to receive the optical signal from the tunable laser portion and provide, to a control logic, feedback related to a wavelength of the optical signal; an amplifier configured to receive the optical signal from the tunable laser portion and change the amplitude of the optical signal to generate an output optical signal; and an output port configured to output the amplified optical signal from the chip; and a control logic coupled with the chip, wherein the control logic is configured to facilitate, based on the feedback, adjustment of the wavelength of the optical signal within the tunable laser portion prior to output of the optical signal to the WLL portion.

Example 19 may include the electronic device of example 18, and/or some other example herein, wherein the tunable laser portion includes a silicon photodiode configured to provide a signal to the control logic related to a measured wavelength of the optical signal within the tunable laser portion; and wherein the control logic is further configured to facilitate adjustment of the wavelength of the optical signal based on the signal received from the silicon photodiode related to the wavelength of the optical signal.

Example 20 may include the electronic device of example 19, and/or some other example herein, wherein the silicon photodiode is further configured to provide a signal to the control logic related to a measured amplitude of the optical signal within the tunable laser portion; and wherein the control logic is further configured to adjust the facilitate adjustment of the amplitude of the optical signal within the tunable laser portion prior to output of the optical signal to the WLL portion.

Example 21 may include the electronic device of any of examples 18-20, and/or some other example herein, wherein the optical signal is output from a front mirror of the tunable laser portion to the WLL.

Example 22 may include the electronic device of any of examples 18-21, and/or some other example herein, wherein the WLL portion includes an athermal ring resonator.

Example 23 may include the electronic device of any of examples 18-21, and/or some other example herein, wherein the WLL portion includes an athermal mach-zehnder interferometer (MZI).

Example 24 may include the electronic device of any of examples 18-23, and/or some other example herein, wherein the WLL portion includes a first silicon photodiode and a second silicon photodiode, and wherein the feedback is based on a first measurement of the wavelength of the optical signal at the first silicon photodiode and a second measurement of the wavelength of the optical signal at the second silicon photodiode.

Example 25 may include the electronic device of example 24, and/or some other example herein, wherein the control logic is to facilitate adjustment of the wavelength of the optical signal within the tunable laser portion based on a comparison of the first measurement to the second measurement.

Example 26 may include the electronic device of example 24, and/or some other example herein, wherein the tunable laser portion includes a phase tuner configured to adjust, based on a signal provided by the control logic related to the feedback, a wavelength of the optical signal within the tunable laser portion prior to provision of the optical signal to the WLL.

Example 27 may include control logic configured to perform a method comprising: identify, from a chip that includes a tunable laser portion and a wavelength locker (WLL) portion, feedback received from the WLL portion, wherein the feedback is related to a wavelength of an optical signal generated by the tunable laser portion, and wherein the wavelength is a selected wavelength of a plurality of possible wavelengths; identify, based on the feedback, occurrence of wavelength drift of the optical signal; and compensate for the wavelength drift by transmitting, to a phase tuner of the tunable laser portion, a control signal, wherein the control signal is to cause the phase tuner to adjust the wavelength of the optical signal within the tunable laser portion to maintain the wavelength of the optical signal.

Example 28 may include the control logic of example 27, and/or some other example herein, wherein the method further comprises: identify, based on a signal received from a silicon photodiode of the tunable laser portion, the occurrence of the wavelength drift of the optical signal.

Example 29 may include the control logic of any of examples 27-28, and/or some other example herein, wherein the WLL portion includes an athermal ring resonator.

Example 30 may include the control logic of any of examples 27-28, and/or some other example herein, wherein the WLL portion includes an athermal mach-zehnder interferometer (MZI).

Example 31 may include the control logic of any of examples 27-30, and/or some other example herein, wherein the WLL portion includes a first silicon photodiode and a second silicon photodiode, and wherein the feedback is based on a first measurement of the wavelength of the optical signal at the first silicon photodiode and a second measurement of the wavelength of the optical signal at the second silicon photodiode.

Example 32 may include the control logic of example 31, and/or some other example herein, wherein the control signal is based on a comparison of the first measurement to the second measurement.

Example 34 may include a chip comprising: a tunable laser portion configured to output, to another element on the chip, an optical signal at a selected wavelength of a plurality of possible wavelengths; a wavelength locker (WLL) portion configured to receive the optical signal from the tunable laser portion and facilitate locking a wavelength of the optical signal output from the tunable laser portion at the selected wavelength; an amplifier configured to receive the optical signal from the tunable laser portion and amplify or attenuate the optical signal to generate an output optical signal; and an output port configured to output the output optical signal from the chip.

Example 35 may include the chip of example 34, and/or some other example herein, wherein the WLL portion is to facilitate locking the wavelength of the optical signal output from the tunable laser portion at the selected wavelength to compensate for wavelength drift.

Example 36 may include the chip of any of examples 34-35, and/or some other example herein, wherein the WLL portion is to facilitate locking the wavelength of the optical signal output from the tunable laser portion at the selected wavelength when the selected wavelength is initially selected.

Example 37 may include the chip of any of examples 34-36, and/or some other example herein, wherein the WLL portion is to facilitate locking the wavelength of the optical signal output from the tunable laser portion at the selected wavelength when the wavelength of the optical signal is changed from a previously selected wavelength to the selected wavelength.

Example 38 may include the chip of any of examples 34-37, and/or some other example herein, wherein the tunable laser portion includes a silicon photodiode configured to facilitate tuning of the optical signal to the selected wavelength.

Example 39 may include the chip of example 38, and/or some other example herein, wherein the silicon photodiode is further configured to facilitate alteration of an amplitude of the optical signal.

Example 40 may include the chip of any of examples 34-39, and/or some other example herein, wherein the optical signal is output from a front mirror of the tunable laser portion to the amplifier.

Example 41 may include the chip of any of examples 34-40, and/or some other example herein, wherein the WLL portion includes an athermal ring resonator.

Example 42 may include the chip of any of examples 34-41, and/or some other example herein, wherein the WLL portion includes an athermal mach-zehnder interferometer (MZI).

Example 43 may include the chip of any of examples 34-42, and/or some other example herein, wherein the WLL portion includes a first silicon photodiode and a second silicon photodiode, wherein the locking of the wavelength of the optical signal at the selected wavelength is based on feedback generated by the WLL based on a first measurement of the wavelength of the optical signal at the first silicon photodiode and a second measurement of the wavelength of the optical signal at the second silicon photodiode.

Example 44 may include the chip of example 43, and/or some other example herein, wherein the feedback is based on a comparison of the first measurement and the second measurement.

Example 45 may include the chip of example 43, and/or some other example herein, wherein the tunable laser portion includes a phase tuner configured to change, based on the feedback, a wavelength of the optical signal within the tunable laser portion prior to provision of the optical signal to the WLL.

Example 46 may include an electronic device comprising: a chip comprising: a tunable laser portion configured to output, to another element of the chip, an optical signal at a selected wavelength of a plurality of possible wavelengths; a wavelength locker (WLL) portion configured to receive the optical signal from the tunable laser portion and provide, to a control logic, feedback related to a wavelength of the optical signal; an amplifier configured to receive the optical signal from the tunable laser portion and change an amplitude of the optical signal to generate an output optical signal; and an output port configured to output the amplified optical signal from the chip; and a control logic coupled with the chip, wherein the control logic is configured to facilitate, based on the feedback, adjustment of the wavelength of the optical signal within the tunable laser portion prior to output of the optical signal to the WLL portion.

Example 47 may include the electronic device of example 46, and/or some other example herein, wherein the tunable laser portion includes a silicon photodiode configured to provide a signal to the control logic related to a wavelength of the optical signal within the tunable laser portion; and wherein the control logic is further configured to facilitate adjustment of the wavelength of the optical signal based on the signal received from the silicon photodiode related to the wavelength of the optical signal.

Example 48 may include the electronic device of any of examples 46-47, and/or some other example herein, wherein the optical signal is output from a front mirror of the tunable laser portion to the WLL.

Example 49 may include the electronic device of any of examples 46-48, and/or some other example herein, wherein the WLL portion includes a first silicon photodiode and a second silicon photodiode, and wherein the feedback is based on a wavelength of the optical signal at the first silicon photodiode and a wavelength of the optical signal at the second silicon photodiode.

Example 50 may include control logic configured to perform a method comprising: identifying, from a chip that includes a tunable laser portion and a wavelength locker (WLL) portion, feedback received from the WLL portion, wherein the feedback is related to a wavelength of an optical signal generated by the tunable laser portion, and wherein the wavelength is intended to be at a selected wavelength of a plurality of possible wavelengths; identifying, based on the feedback, that the wavelength of the optical signal generated by the tunable laser portion is not at the selected wavelength; and transmitting, to a phase tuner of the tunable laser portion, a control signal, wherein the control signal is to cause the phase tuner to adjust the wavelength of the optical signal within the tunable laser portion such that the wavelength of the optical signal within the tunable laser portion is the selected wavelength.

Example 51 may include the control logic of example 50, and/or some other example herein, wherein the WLL portion includes an athermal ring resonator or an athermal mach-zehnder interferometer (MZI).

Example 52 may include the control logic of any of examples 50-51, and/or some other example herein, wherein the WLL portion includes a first silicon photodiode and a second silicon photodiode, and wherein the feedback is based on a wavelength of the optical signal at the first silicon photodiode and a wavelength of the optical signal at the second silicon photodiode.

Example 53 may include the control logic of any of examples 50-52, and/or some other example herein, wherein the feedback indicates that the wavelength is not at the selected wavelength due to wavelength drift or due to a change in the selected wavelength.

Example 54 may include a photonic integrated circuit, comprising: a first portion on a chip, the first portion comprising a first optical gain region and at least first and second ring modulators; a second portion on the chip and optically coupled to the first portion, the second portion comprising a ring resonator and at least first and second silicon photodiodes; and a third portion on the chip and optically coupled to the first portion and to the second portion, the third portion comprising a second optical region and a third silicon photodiode.

Example 55 may include the photonic integrated circuit of example 54, and/or some other example herein, wherein the first optical gain region, the second optical gain region, the first ring modulator, the second ring modulator, and the ring resonator comprise silicon.

Example 56 may include the photonic integrated circuit of any of examples 54-55, and/or some other example herein, wherein at least one of the first optical gain region and the second optical gain region comprise a III-V material.

Example 57 may include the photonic integrated circuit of any of examples 54-56, and/or some other example herein, wherein the first portion comprises a tunable laser, wherein the second portion comprises a wavelength locker, and wherein the third portion comprises an optical amplifier.

Example 58 may include the photonic integrated circuit of any of examples 54-57, and/or some other example herein, wherein the first portion further comprises a loop mirror optically coupled to the first optical gain region.

Example Z01 may include an apparatus comprising means to perform one or more elements of a method described in or related to any of the examples herein, and/or any other method, process, or technique process described herein, or portions or parts thereof.

Example Z02 may include an apparatus comprising logic, modules, or circuitry to perform one or more elements of a method described in or related to any of the examples herein, and/or any other method, process, or technique described herein, or portions or parts thereof.

Example Z03 may include a method, technique, or process as described in or related to any of the examples herein, and/or any other method, process, or technique described herein, or portions or parts thereof.

Example Z04 may include a signal as described in or related to any of the examples herein, and/or any other method, process, or technique described herein, or portions or parts thereof.

Example Z05 may include an apparatus comprising one or more processors and non-transitory computer-readable media that include instructions which, when executed by the one or more processors, are to cause the apparatus to perform one or more elements of a method described in or related to any of the examples herein, and/or any other method, process, or technique described herein, or portions or parts thereof.

Example Z06 may include one or more non-transitory computer readable media comprising instructions that, upon execution of the instructions by one or more processors of an electronic device, are to cause the electronic device to perform one or more elements of a method described in or related to any of the examples herein, and/or any other method, process, or technique described herein, or portions or parts thereof.

Example Z07 may include a computer program related to one or more elements of a method described in or related to any of the examples herein, and/or any other method, process, or technique described herein, or portions or parts thereof.

The invention claimed is:

1. A chip comprising:

a tunable laser portion configured to output, to another element on the chip, an optical signal at a selected wavelength of a plurality of possible wavelengths;

a wavelength locker (WLL) portion configured to receive the optical signal from the tunable laser portion and facilitate locking a wavelength of the optical signal output from the tunable laser portion at the selected wavelength;

wherein the WLL portion includes a silicon ring resonator and a titanium dioxide (TiO2) waveguide cladding, wherein a negative thermo-optic coefficient of the TiO2 waveguide cladding compensates for a positive thermo-optic coefficient of the silicon ring resonator to provide athermal operation of the WLL portion;

an amplifier configured to receive the optical signal from the tunable laser portion and amplify or attenuate the optical signal to generate an output optical signal; and an output port configured to output the output optical signal from the chip.

2. The chip of claim 1, wherein the WLL portion is to facilitate locking the wavelength of the optical signal output from the tunable laser portion at the selected wavelength to compensate for wavelength drift.

3. The chip of claim 1, wherein the WLL portion is to facilitate locking the wavelength of the optical signal output from the tunable laser portion at the selected wavelength when the selected wavelength is initially selected.

4. The chip of claim 1, wherein the WLL portion is to facilitate locking the wavelength of the optical signal output from the tunable laser portion at the selected wavelength when the wavelength of the optical signal is changed from a previously selected wavelength to the selected wavelength.

5. The chip of claim 1, wherein the tunable laser portion includes a silicon photodiode configured to facilitate tuning of the optical signal to the selected wavelength.

6. The chip of claim 5, wherein the silicon photodiode is further configured to facilitate alteration of an amplitude of the optical signal.

7. The chip of claim 1, wherein the optical signal is output from a front mirror of the tunable laser portion to the amplifier.

8. The chip of claim 1, wherein the WLL portion includes an athermal ring resonator.

9. The chip of claim 1, wherein the WLL portion includes an athermal mach-zehnder interferometer (MZI).

10. The chip of claim 1, wherein the WLL portion includes a first silicon photodiode and a second silicon photodiode, wherein the locking of the wavelength of the optical signal at the selected wavelength is based on feedback generated by the WLL based on a first measurement of the wavelength of the optical signal at the first silicon photodiode and a second measurement of the wavelength of the optical signal at the second silicon photodiode.

11. The chip of claim 10, wherein the feedback is based on a comparison of the first measurement and the second measurement.

12. The chip of claim 10, wherein the tunable laser portion includes a phase tuner configured to change, based on the feedback, a wavelength of the optical signal within the tunable laser portion prior to provision of the optical signal to the WLL.

13. A photonic integrated circuit, comprising:

a first portion on a chip, the first portion comprising a first optical gain region and at least first and second ring modulators;

a second portion on the chip and optically coupled to the first portion, the second portion comprising a ring resonator having a titanium dioxide (TiO2) waveguide cladding configured to compensate for a positive thermo-optic coefficient of the ring resonator to provide athermal operation, and at least first and second silicon photodiodes; and a third portion on the chip and optically coupled to the first portion and to the second portion, the third portion comprising a second optical region and a third silicon photodiode.

14. The photonic integrated circuit of claim 13, wherein the first optical gain region, the second optical gain region, the first ring modulator, the second ring modulator, and the ring resonator comprise silicon.

15. The photonic integrated circuit of claim 13, wherein at least one of the first optical gain region and the second optical gain region comprise a III-V material.

16. The photonic integrated circuit of claim 13, wherein the first portion comprises a tunable laser, wherein the second portion comprises a wavelength locker, and wherein the third portion comprises an optical amplifier.

17. The photonic integrated circuit of claim 13, wherein the first portion further comprises a loop mirror optically coupled to the first optical gain region.

* * * * *